US011370055B2

(12) United States Patent
Di Domenico et al.

(10) Patent No.: US 11,370,055 B2
(45) Date of Patent: Jun. 28, 2022

(54) ELECTRON BEAM 3D PRINTING MACHINE

(71) Applicant: Consorzio Di Ricerca Hypatia, Grottaferrata (IT)

(72) Inventors: Gildo Di Domenico, Grottaferrata (IT); Flavio Lucibello, Grottaferrata (IT); Lorenzo Scatena, Grottaferrata (IT); Mariano Zarcone, Grottaferrata (IT)

(73) Assignee: Consorzio Di Ricerca Hypatia, Grottaferrata (IT)

( * ) Notice: Subject to any disclaimer, the term of this patent is extended or adjusted under 35 U.S.C. 154(b) by 810 days.

(21) Appl. No.: 16/322,594

(22) PCT Filed: Aug. 4, 2017

(86) PCT No.: PCT/IB2017/054796
§ 371 (c)(1),
(2) Date: Feb. 1, 2019

(87) PCT Pub. No.: WO2018/025239
PCT Pub. Date: Feb. 8, 2018

(65) Prior Publication Data
US 2019/0202000 A1    Jul. 4, 2019

(30) Foreign Application Priority Data
Aug. 4, 2016  (IT) .......................... 102016000082446

(51) Int. Cl.
*H01J 37/12*    (2006.01)
*H01J 37/147*   (2006.01)
(Continued)

(52) U.S. Cl.
CPC .......... *B23K 15/0086* (2013.01); *B22F 12/00* (2021.01); *B23K 15/02* (2013.01);
(Continued)

(58) Field of Classification Search
CPC ........... H01J 37/06; H01J 37/12; H01J 37/147
See application file for complete search history.

(56) References Cited

U.S. PATENT DOCUMENTS

| 2006/0061285 A1 | 3/2006 | Lewellen et al. |
| 2014/0061497 A1 | 3/2014 | Dinu-Gurtler et al. |
| 2015/0004045 A1 | 1/2015 | Ljungblad |

FOREIGN PATENT DOCUMENTS

| JP | 2005-050646 A | 2/2005 |
| SU | 792 724 A1 | 6/1990 |

OTHER PUBLICATIONS

International Search Report and Written Opinion prepared by the European Patent Office, acting as the international searching authority, for corresponding international application PCT/IB2017/054796 dated Nov. 21, 2017.

(Continued)

*Primary Examiner* — Joseph L Williams
(74) *Attorney, Agent, or Firm* — McCarter & English, LLP

(57) ABSTRACT

An electron beam 3D printing machine, comprising a chamber for generating and accelerating an electron beam and an operating chamber in which a metal powder is melted, with the consequent production of a three-dimensional product. The chamber for generating and accelerating an electron beam houses means for generating an electron beam and means for accelerating the generated electron beam, while the operating chamber houses at least one platform for depositing the metal powder, metal powder handling means and electron beam deflection means. The accelerator means for the generated electron beam comprise a series of resonant cavities fed with an alternating signal.

4 Claims, 1 Drawing Sheet

(51) Int. Cl.
| | |
|---|---|
| B23K 15/00 | (2006.01) |
| H01J 37/301 | (2006.01) |
| H01J 33/02 | (2006.01) |
| H01J 5/18 | (2006.01) |
| H03B 9/04 | (2006.01) |
| H01J 37/305 | (2006.01) |
| B22F 12/00 | (2021.01) |
| B33Y 30/00 | (2015.01) |
| B23K 15/02 | (2006.01) |
| H01J 25/10 | (2006.01) |
| H01J 37/06 | (2006.01) |
| H01J 37/315 | (2006.01) |
| B22F 10/10 | (2021.01) |

(52) U.S. Cl.
CPC ............... *B33Y 30/00* (2014.12); *H01J 5/18* (2013.01); *H01J 25/10* (2013.01); *H01J 33/02* (2013.01); *H01J 37/06* (2013.01); *H01J 37/12* (2013.01); *H01J 37/147* (2013.01); *H01J 37/301* (2013.01); *H01J 37/305* (2013.01); *H01J 37/315* (2013.01); *H03B 9/04* (2013.01); *B22F 10/10* (2021.01); *B23K 15/0026* (2013.01); *H01J 2237/0473* (2013.01); *H01J 2237/3104* (2013.01); *H01J 2237/3128* (2013.01); *Y02P 10/25* (2015.11)

(56) References Cited

OTHER PUBLICATIONS

International Preliminary Report on Patentability prepared by the European Patent Office, acting as the international preliminary examining authority, for corresponding international application PCT/IB2017/054796 dated Jul. 27, 2018.

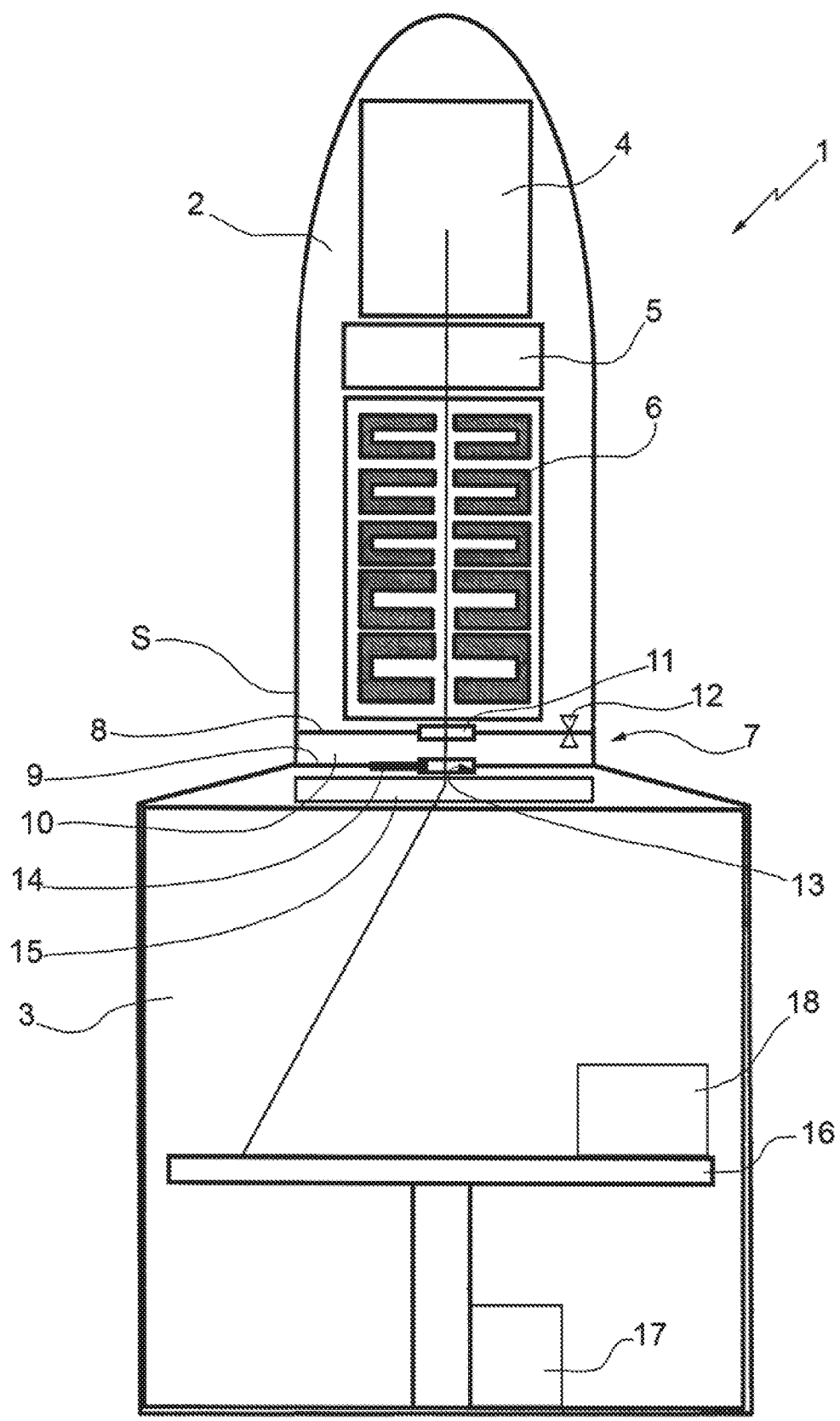

ELECTRON BEAM 3D PRINTING MACHINE

CROSS-REFERENCE TO RELATED APPLICATIONS

This application is the National Stage entry under 35 U.S.C. § 371 of International Application Number PCT/IB2017/054796 filed on Aug. 4, 2017 and published on Feb. 8, 2018 under publication number WO 2018/025239 A1, which claims the benefit of priority under 35 U.S.C. § 119 of Italian patent application number 102016000082446 filed Aug. 4, 2016.

TECHNICAL FIELD

The present invention relates to an electron beam 3D printing machine.

BACKGROUND ART

In 3D printing technology for PBD metals (Powder Bed Additive Manufacturing), a high-power density heat source is used for melting metal powders in a selective manner. The melting of the powder takes place in a localized manner in certain specific zones where compact material must be obtained for building the three-dimensional component. This component is made via the melting and subsequent solidification of layers of powder gradually deposited one on top of the other.

In particular, the presence of an operating chamber is envisaged in which powder melting process takes place in a controlled atmosphere. There are some handling devices inside the operating chamber that enable controlling the supply of powder.

In general, a certain quantity of powder is deposited, in one of the many ways described in the art, on the previous thickness, progressively covering the object to be made. The quantity of powder that is deposited on the construction bed depends on the thickness of the layer of powder used during the single scan of the heat source.

Once the construction bed has been covered by the desired thickness of powder, the high-power density heat source is activated and set in motion over the construction bed. Obviously, the movement of the high-power density heat source over the single layer of powder depends on the geometry of the component to be made and how it has been divided into layers (slices) by the CAD/CAM software, as in the case of 3D Printing. Once the scan of all the surface of the layer of powder where it was necessary to obtain zones of solid and compact material has been completed, the construction bed is moved downwards by a distance approximately equal to that of the layer of powder initially deposited. Depending on the type of material being processed, the difference between the layer of powder initially deposited on the construction bed and the thickness of the melted layer tends to undergo alteration. At this point, the previously indicated operations are repeated, with the depositing of successive layer of powder and its localized melting, only where it is required to build a portion of dense material.

Thus, the high-power density heat source melts the powder only where it is required to have compact material in order to create the component, as indicated on the CAD drawing.

It must be pointed out that the entire selective melting process takes place in an inert gas atmosphere (nitrogen, used more often as it is inexpensive, or argon in the case of particularly reactive materials, such as titanium for example) to limit oxidation.

The above procedure uses two types of high power density heat source: (a) laser and (b) electron beam.

The laser beam focuses a variable spot of between 70 and 200 µm, which represents the lower limit of current technology, on the powder to be melted. The level of precision of the item to create as well as the speed of execution are tied to the size of the spot. Usually, an ytterbium-doped fibre source is used as the laser source. The laser beam generated is characterized by a wavelength approximately equal to 1060-1070 nm, with powers that vary between 200 W and 400 W. To increase productivity, the tendency is that of increasing this power, taking it to values of around a kW. Once generated, the laser beam is focused by lenses and opportunely deviated by mirrors moved by a galvanometric system. The scanning speeds of the laser beam used have values from 1 m/s up to approximately 10 m/s.

The other source adopted in this technology is the electron beam, which is produced by an electron gun and is accelerated by a static electric field with voltages of up to 50-60 kV. The size of the beam and, consequently, the definition of the melting is typically not less than 200 µm. This characteristic is due to the space charge, i.e. the reciprocal repulsion between electrons that takes place along the path from the gun to the target.

As may appear instinctive to an expert in the art, this characteristic constitutes a limitation in the use of the electron beam as a high-power density heat source. Among other things, as previously mentioned, there is an attempt to increase the power of the heat source to increase productivity. This can be achieved in an electrostatic gun by increasing the current, and therefore the space charge and its size, or by increasing the acceleration voltage. However, this last option has certain technological limits due to high electric fields, or rather to the probability of discharge and spurious currents, due to the field effect, which can disturb the process.

Summarizing, with the voltage values allowed by current technology, the space charge effect, i.e. the reciprocal repulsion of the electrons, is still an insurmountable limit, as it is sufficient to diverge the beam so as to make a reduction in the size of the spot impossible. For the above reasons, printing machines that use a laser manage to have better resolution in the details and better surface quality than electron beam ones.

However, by having higher power levels, electron beam machines are usually more productive than laser ones and, unlike the latter, provide electron beam energy transfer to the powder independently of the type of powder and its surface. Furthermore, another advantage deriving from using the electron beam regards the scanning speed. In fact, the ray of electrons is deviated by means of magnetic fields, while the laser ray is deviated by a galvanometric system of mirrors, the movement of which necessarily entails the presence of mechanical inertia and, in consequence, longer actuation times.

There was thus awareness of the need for having an electron beam 3D printing machine that, in addition to having the above advantages, could have a melting definition equal to or better than those achievable using a laser.

The applicant has developed an electron beam 3D printing machine capable of operating with a spot size in the order of 30 μm, thus succeeding in achieving a melting definition equal to or better than those obtained using a laser.

DISCLOSURE OF INVENTION

The subject of the present invention is an electron beam 3D printing machine, the basic characteristics of which are set forth in claim 1 and the preferred and/or auxiliary characteristics of which are set forth in claims 2-4.

BRIEF DESCRIPTION OF THE DRAWINGS

For illustrative purposes, a non-limitative example is described below, with the aid of the accompanying FIGURE, which is an extremely schematic view of the 3D printing machine forming the subject of the present invention.

BEST MODE FOR CARRYING OUT THE INVENTION

In the accompanying FIGURE, reference numeral 1 indicates, as a whole, the 3D printing machine according to the present invention.

The 3D printing machine 1 comprises an outer structure S defining a chamber 2 for generating and accelerating the electron beam and an operating chamber 3 in which the metal powder is melted to create the three-dimensional product.

Usually, a vacuum of approximately $10^{-7}$ mbar is created in the chamber 2 for generating and accelerating the electron beam, while a vacuum of approximately $10^{-3}$ mbar is created in the operating chamber 3.

Following the path of the electron beam, the 3D printing machine 1 comprises, in sequence, a cathode 4, preferably thermionic, a set of electrostatic lenses 5 designed to create a spot of the desired size, and a series of resonant cavities 6.

The cathode 4, the set of electrostatic lenses 5 and the series of resonant cavities 6 are all housed inside chamber 2.

The cathode 4 is capable of providing pulsed currents ranging between 0.5 and 2 mA.

The cathode must be able to support high current densities, as the emitting surface must necessarily be very small in order to create the small size of final spot.

The set of electrostatic lenses 5 comprises a series of accelerator grids, the first of which is at a lower potential with respect to the cathode, for the purpose of only allowing the passage of electrons within a specific energy range and a phase around that of the so-called synchronous phase.

In fact, as the field inside the resonant cavities is sinusoidal, it is necessary that there is a correct phase relationship with respect to the incoming beam in order for it to receive the right amount of energy. In reality, the beam arrives at the entrance of the cavity with a certain space and energy dispersion, and therefore with different phases with respect to the accelerator field. It is possible to demonstrate that the electrons that have a correct energy range around the synchronous phase group together in bunches separated from each other by a period of the sinusoidal field and will move approximately in the same direction with almost the same positions, phases and energy.

The 3D printing machine 1 also comprises a window assembly 7 designed to allow the passage of electrons and to separate the chamber 2 from the operating chamber 3 in a fluid-tight manner.

The window assembly 7 comprises an upper dividing wall 8 and a lower dividing wall 9 that forms, with the upper dividing wall 8, a pressure compensation chamber 10. A window 11, through which the electron beam passes, and a valve 12, for placing the chamber 2 and the pressure compensation chamber 10 in communication, are inserted in the upper dividing wall 8. An aperture 13 equipped with a closing flange 14 is provided in the lower dividing wall 9.

In use, starting from a configuration in which the valve 12 is open and the aperture 13 is closed by means of the closing flange 14, a depression is created inside chamber 2 until a value of approximately $1\times10^{-7}$ mbar is reached. Since the valve is open, the same depression reaches the pressure compensation chamber 10. At this point, keeping the aperture 13 closed, a depression is created in chamber 3 until a value of approximately $1\times10^{-3}$ mbar is reached. Once the depression has been created in chamber 3, the valve 12 is closed and then the aperture 13 is opened. In the process, the pressure compensation chamber 10 will pass from a pressure of $1\times10^{-7}$ mbar to a pressure of $1\times10^{-3}$ mbar.

As may appear evident to an expert in the art, the window assembly 7 enables having a window 11 of a few μm in thickness (down to 1 μm) without encountering problems of failure due to the pressure difference between the two sides of the window.

For an adequate understanding of the utility of the window assembly 7 according to the invention, it should be stressed that the thinnest thickness possible is required for the window in order to prevent the material of the window from melting or the electron beam from degrading. In fact, the energy of the electron beam, concentrated in a very small spot, (the main advantage of using this device) could cause the window to melt, in the same way in which it melts the powder, which is the specific function of the device.

Nevertheless, according to the known art, too thin a window would not be able to support the pressure differences that would necessarily be created between the two sides of the window during the step of depressurizing the chambers.

The window assembly 7 succeeds in guaranteeing that the window is never subjected to a significant pressure difference, thus enabling the use of a window with a thickness reduced to a few micrometres and a surface of less than 3 mm².

The window 11 is preferably made of a material chosen from beryllium, titanium, and titanium-chromium.

The 3D printing machine 1 also comprises magnetic deflection means 15 designed to carry out the positioning of the electron beam on the powder bed, a worktop 16 on which the metal powder to be melted is deposited, handling means 17 for the worktop 16, and metal powder handling means 18.

The magnetic deflection means 15, the worktop 16, the worktop handling means 17, and the metal powder handling means 18 are housed in the operating chamber 3.

In particular, the magnetic deflection means 15 comprise further toroidal electromagnetic deflection coils, such as to direct the beam on any point of the worktop by using variable electric currents.

During operation, the generated electron beam is continuously deviated so as to trace a pattern defined by the control software to melt the powder precisely at the desired points.

The deflection is a consequence of the electron beam passing through a variable magnetic field produced by the deflection coils mounted immediately after the window assembly 7.

In order to prevent the deflection from causing an increase in the size of the spot (defocusing) at the perimeter of the melting plane, it is generally desirable that the field generated by the coils is uniform and more intense at the inlet end of the beam. This is achieved by using deflection coils with a cosine-like distribution. However, when this field geometry is used in deflection with a sufficiently large angle, raster damage occurs, in the sense that the electron beam is less deflected at the corners with respect to other areas of the worktop; thus, the shape that would be obtained by projecting a rectangle or a square with the corners corresponding to the ends of the worktop would be similar to a cushion rather than a rectangle.

This type of distortion can be compensated by the use of additional elements, such as anti-pincushion magnets, but it was preferred to correct it via software.

In consequence, an initial calibration step was necessary in which the deflection system's piloting software, in self-learning mode, can adjust the piloting as a function of the desired position.

Alternatively, a raster scan, i.e. line by line to cover the entire surface of interest, defined as a "frame" by analogy with the cathode ray tube used in televisions, has been produced. In this case, the frequency of each frame was given by speed with which the electron beam was able to follow all the lines and only melt powder in the required points by modulating the electron beam. Melting can also take place in a number of "frames" greater than one, in order to have advantages in the system's thermal stability. The number of lines must be proportional to the desired precision; for example, with a spot having a 30 micron diameter, on a 400 mm×400 mm platform, approximately 13000 progressive and non-interlaced lines need to be considered. The duration of a complete scan mainly depends on the material, because of the necessary melting energy, and the energy of the electron beam.

The 3D printing machine according to the present invention stands out from 3D printers of the know art in that it uses a series of resonant cavities with time-variable fields obeying a sinusoidal law and not a static electric field as the means for accelerating the electron beam.

Such a difference enables containing the size of the spot to even smaller dimensions than those obtainable with lasers. In fact, the electron beam is captured/confined as soon as it leaves the thermionic cathode 4 and quickly accelerated to high (and easily variable) energy levels, therefore allowing the space charge, i.e. the reciprocal repulsion between electrons that takes place along the path from the gun to the target, to be kept to a minimum.

Furthermore, the series of accelerator cavities 6 ensures greater flexibility and dynamism, enabling easy adjustment of the electron beam's energy with the advantage, for example, of being able to vary the penetration of the electrons into the powder to be melted. At the same time, the power level of the beam can be modified, allowing total flexibility in beam scanning times, according to needs.

As has emerged from the foregoing description, to obtain high power from the electron beam without increasing the current, and consequently the size of the spot, one must act on the accelerator field. To avoid limitations due to the maximum possible value of the single static electric field used in the current technology, the present invention turns to a subdivision of the electrons' acceleration thrust, obtained by means of a series of several resonant cavities that contain sinusoidal electromagnetic fields with frequencies of about 10 GHz.

The cavities are powered by a generator through a transmission line or a waveguide. For acceleration, the electromagnetic field that is set up in the cavities has the electric field component oriented along the direction of propagation of the particles. Furthermore, as the field is sinusoidal, arrangements have been made such that there is a correct phase relationship with respect to the electron beam entering in each cavity, so that it receives the right amount of energy on passing each cavity.

In addition, the longitudinal dimension of the cavities has been adapted to the growing speed of the particles to conserve their synchronism with the field.

A power frequency of about 10 GHz, enables keeping the sizes of the oscillating cavities compact, so that the whole of the accelerator line remains under one metre.

Summing up, the 3D printing machine forming the subject of the present invention has the great advantage of combining the precision obtainable through a laser source with the productivity obtainable through an electron beam source and, at the same time, enables benefitting from significant flexibility in beam power and energy.

The invention claimed is:

1. An electron beam 3D printing machine, comprising a first chamber for generating and accelerating an electron beam and a second operating chamber, in which a metal powder is melted, with the consequent production of a three-dimensional product; the second chamber housing at least one platform for depositing the metal powder, metal powder handling means and electron beam deflection means; wherein said 3D printing machine comprises, in sequence, a cathode housed in said first chamber and designed to provide currents ranging between 0.5 and 2 mA; a set of electrostatic lenses housed in said first chamber; a series of resonant accelerator cavities with time-variable electromagnetic fields obeying a sinusoidal law, the oscillation frequency of which is in the GHz range, and housed in said first chamber; and a window assembly arranged between said first chamber and said second chamber; said window assembly comprising an upper dividing wall and a lower dividing wall that, with the upper dividing wall, forms a compensation chamber; a window, through which the electron beam passes, and a valve, for placing said first chamber and the pressure compensation chamber in communication, being inserted in said dividing wall; an, aperture equipped with a closing flange being provided in said lower dividing wall.

2. The 3D printing machine according to claim 1, wherein the accelerator unit is formed by a series of cavities oscillating at the resonant frequency.

3. The 3D printing machine according to claim 1, wherein said cathode is a thermionic or field emission cathode.

4. The 3D printing machine according to claim 1, wherein said set of electrostatic lenses comprises a first grid at a lower potential with respect to the cathode for the purpose of only allowing the passage of electrons within a specific energy range, and a plurality of successive grids with potentials of a few thousand volts to create a static electric acceleration field before entry to the accelerator section with resonant cavities.

* * * * *